United States Patent [19]

Kamo et al.

[11] Patent Number: 5,510,323
[45] Date of Patent: Apr. 23, 1996

[54] $TL_1(BA_{1-X}SR_8)_2CA_2CU_3OY$ OXIDE SUPERCONDUCTOR AND METHOD OF PRODUCING THE SAME

[75] Inventors: Tomoichi Kamo, Ibaraki; Seizi Takeuchi, Hitachiota; Shinpei Matsuda, Ibaraki; Atsuko Soeta, Mito; Takaaki Suzuki, Katsuta; Yutaka Yoshida, Hitachi, all of Japan

[73] Assignee: Hitachi, Ltd., Tokyo, Japan

[21] Appl. No.: 418,476

[22] Filed: Apr. 7, 1995

Related U.S. Application Data

[63] Continuation of Ser. No. 31,466, Mar. 15, 1993, abandoned, which is a continuation of Ser. No. 625,439, Dec. 11, 1990, abandoned, which is a continuation-in-part of Ser. No. 385,101, Jul. 26, 1989, abandoned.

[30] Foreign Application Priority Data

Jul. 29, 1988 [JP] Japan .................................. 63-188470
Feb. 13, 1989 [JP] Japan .................................... 1-31058
Feb. 27, 1989 [JP] Japan .................................... 1-42998

[51] Int. Cl.$^6$ ........................... H01B 12/00; H01L 39/12
[52] U.S. Cl. .......................... 505/120; 505/124; 505/782; 505/783; 252/521
[58] Field of Search .................................. 252/518, 521; 505/100, 120, 124, 782, 783

[56] References Cited

U.S. PATENT DOCUMENTS 5,073,536  12/1991  Sheng et al. ................................. 505/1
5,300,482   4/1994  Doi et al. ................................. 505/783

OTHER PUBLICATIONS

Nagashima et al "Superconductivity in $Tl_{1.5}SrCa Cu_2O_x$," J.J.A.P. vol. 27, No. 6, Jun. 1988 pp. L1077–L1079.

*Primary Examiner*—Paul Lieberman
*Assistant Examiner*—M. Kopec
*Attorney, Agent, or Firm*—Antonelli, Terry, Stout & Kraus

[57] ABSTRACT

An oxide superconductor comprising a perovskite type oxide compound of thallium, strontium, calcium and copper or thallium, strontium, balium, calcium and copper is produced by absorbing thallium in a gaseous phase into a mixture of strontium oxide or strontium oxide and barium oxide, calcium oxide, and copper oxide or a mixture of compounds capable of producing these oxides upon firing. From this superconductor are provided a superconductor wire material, tape-shaped wire material, coil, thin film, magnet, magnetic shielding material, printed circuit board, measuring device, computer, power storing device and etc.

1 Claim, 7 Drawing Sheets

$TL_1(BA_{1-x}SR_8)_2CA_2CU_3OY$ OXIDE SUPERCONDUCTOR AND METHOD OF PRODUCING THE SAME

This application is a continuation application of Ser. No. 031,466, filed Mar. 15, 1993, now abandoned which application is a continuation application of Ser. No. 625,439, filed Dec. 11, 1990 (now abandoned), which application is a continuation-in-part application of Ser. No. 385,101, filed Jul. 26, 1989 (now abandoned).

BACKGROUND OF THE INVENTION

1. Field of the Invention

The present invention relates to an oxide superconductor containing thallium (Tl), a method for producing the same and an applied apparatus using the oxide superconductor and in particular to a novel oxide superconductor containing thallium and having a high critical temperature.

2. Description of Related Art

Starting from the discovery of La-Ba-Sr-Cu-O, intensive researches and developments have been made on oxide superconductors in application of superconducting technique using liquid nitrogen as a refrigerant based on Y-Ba-Cu-O which has a critical temperature of higher than 90 K (M. K. Wu, J. R. Ashburn, C. J. Torng, Y. Q. Wand and C. W. Chu: Phys. Rev. Lett. 58 (1987), 908).

Remarkable development has been made on materials having high critical temperatures and in 1988, Bi-Sr-Ca-Cu-O oxides were found to be superconductors having a critical temperature in the level of 105K (H. Maeda, Y. Tanaka, M. Fukutomi and T. Asano: Jpn. J. Appl. Phys. 27 (1988), p. L209) and Tl-Ba-Ca-Cu-O oxides were found to be superconductors having a critical temperature in the level of 120 K (Z. Z. Sheng and A. M. Herman: Nature 322 (1988), 55).

These have the structures where copper oxide is inserted in the form of layers between $Bi_2O_2$ double layers or $Tl_2O_2$ double layers and as the number n of $CuO_2$ layer, n=1, 2, 3 were confirmed in bulk materials.

Thereafter, Tl-Ba-Ca-Cu-O superconductors in the form of bulk materials were confirmed to have a structure comprising copper oxide is inserted as layers between TlO single layers with the number of $CuO_2$ layer n=1, 2, 3. (S. S. Parkin, V. Y. Lee, A. I. Nazzal, R. Savoy, R. Beyers and S. J. Laplace: Phys. Rev. Lett. 61 (1988), 750, H. Ihara, M. Hirabayashi, M. Jo, N. Terada, K. Hayashi, A. Negishi, M. Tokumoto, H. Oyanagi, R. Sugie, I. Hayashida, T. Shimomura and S. Ohashi: Proc. 1988, MRS Int. Meet. Advanced Materials, 1988, Materials Research Society).

These are generally produced by milling and mixing powders of carbonates or oxides of strontium and calcium and oxides of bismuth and copper (in case of Tl-Ba-Ca-Cu-O, carbonates or oxides of barium and calcium and oxides of thallium and copper) and firing the mixture at 850°–920° C. for 5 minutes–10 hours in air or oxygen.

However, in a Bi-Sr-Ca-Cu-O material there coexist at least two superconductor phases of critical temperatures in the level of –80 K and in the level of 105 K and unit is difficult to produce each of them as a single phase.

With reference to the Bi-Sr-Ca-Cu-O material, it has been proposed to increase a volume fraction of high temperature phase in the material by replacing a part of Bi with Pb or by producing it under low oxygen partial pressure. However, removal of heterogeneous phase is not sufficient. (M. Takano, J. Takada, K. Oda, H. Kitaguchi, Y. Mimura, Y. Ikeda, Y. Tomii and H. Mazaki: Jpn. J. Appl. Phys. 27 (1988), P. L1041, U. Endo, S. Koyama and T. Kawai: Jpn. J. Appl. Phys. 27 (1988), P. L1476).

Thus, superconductors of high critical current density have not been obtained. On the other hand, in case of Tl-Ba-Ca-Cu-O, since thallium oxide has a high vapor pressure, adjustment of composition is important and synthesis of the single phase is difficult. (See, for example, Nikkei Chodendo (Nikkei: Superconduction), Mar. 21, 1988).

According to the above-mentioned conventional compositions and methods for preparation, critical temperatures of the resulting oxide superconductors are high, namely, 105 K for a Bi type and 118–125 K for a Tl type, but oxide crystals of a single phase cannot be obtained and a plurality of crystal phases are obtained in admixture.

This causes the problems in application of this material to superconducting wire materials and thin film devices that the desired high current density cannot be obtained and the critical temperature is low.

Causes for these problems are still not clear, but it seems that these are caused by the presence of 2–7 kinds of superconductors different in crystal form in the Bi type and Tl-type superconductors, respectively and scattering of composition of raw materials, scattering of oxygen partial pressure and temperature at preparation and change in composition due to change in equilibrium of crystal phase and volatilization of raw materials.

SUMMARY OF THE INVENTION

An object of the present invention is to provide a thallium-containing oxide superconductor which is free from the problems seen in the preparation thereof and which has a high critical temperature, is homogeneous, high in purity and high in volume fraction and high in critical current density and critical magnetic field. Here, "volume fraction" means a proportion of superconductor in volume in superconducting material.

Another object of the present invention is to provide a method for producing the Tl-containing oxide superconductor.

Still another object of the present invention is to provide superconductor devices such as a superconductor wire material, superconducting thin film, magnet, superconducting coil, magnetic shieled material, print circuit board, measuring device, computer, and power storage device.

DETAILED DESCRIPTION OF PREFERRED EMBODIMENTS

Figure 1:
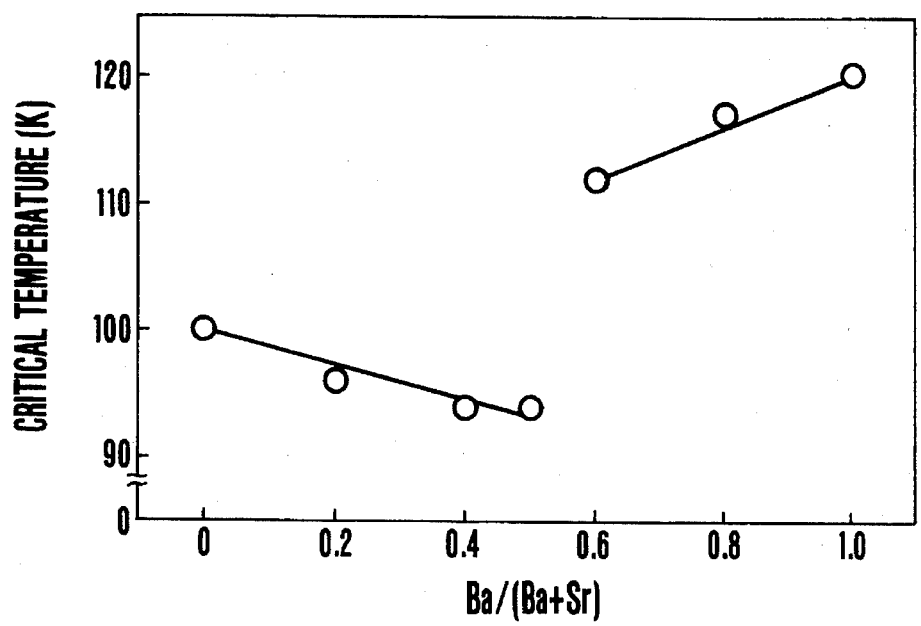
FIG. 1 is a graph which shows a relation between critical temperature of the sintered body obtained in Example 1 of the present invention and compositional ratio Sr/Ba.

The inventors have made intensive research for attaining the above objects and have found the following composition and method for preparation. That is, by providing a composition comprising oxide containing thallium (Tl), barium (Ba) and/or strontium (Sr), calcium (Ca) and copper (Cu), a superconducting material high in critical temperature and volume fraction of superconductor is obtained. According to this oxide superconductor, a single phase of a specific crystal structure can be easily obtained and a superconducting material having a high volume fraction of superconductor can be produced by adjusting an oxygen partial pressure, synthesis temperature and compositional ratio of raw material powder charged.

Furthermore, the superconducting material can have a single superconductor phase and have a high volume fraction of superconductor by inhibiting evaporation of thallium (Tl) and reducing deviation of composition by adjusting a firing temperature or oxygen partial pressure or by increasing airtightness of vessel used for firing.

That is, in firing a composition comprising oxides containing thallium, at least one element selected from strontium and barium, calcium and copper, there is provided a step of absorbing thallium in a gaseous phase into a composition comprising oxides containing at least one element selected from strontium and barium, calcium, and copper, whereby a superconductor high in critical temperature and high in volume fraction can be obtained.

According to this superconductor, the desired superconducting phase as a single phase and in a high volume fraction state is obtained by adjusting an oxygen partial pressure and synthesis temperature.

The oxygen partial pressure and synthesis temperature can be changed by adding to the above composition a compound of lithium, potassium, sodium, cesium, rubidium, lead, or the like as a sintering agent and replacing a part of the composition therewith and the superconductor can be made to a single phase.

Among these elements of lithium, potassium, sodium, cesium, rubidium and lead, those which have vapor pressure in the region of synthesis temperature can be absorbed in a gaseous phase in the same manner as in absorption of thallium.

Raw materials for the composition of the present invention have no special limitation as far as they can provide desired oxides upon reaction at firing and oxides, nitrates, carbonates, halides, organic acid salts, organometallic complexes of thallium (Tl), barium (Ba), strontium (Sr), calcium (Ca) and copper (Cu) elements can be used. Among them, preferred are oxides, nitrates and carbonates. There are also no special limitations in preparation of a mixture of raw materials and there may be employed a method of directly mixing and grinding solids of raw materials, a method of preparing mixed hydroxides, mixed carbonates, mixed oxalates or a composite thereof which is a precursor for the composition from aqueous solutions of the raw materials, e.g., a coprecipitation method (consecutive precipitation, intimate coprecipitation) and precipitation and kneading method. Furthermore, there may be also employed a method of previously preparing some components of raw materials by coprecipitation or precipitation and kneading and thereafter impregnating them with a solution of other components and a method of previously firing some components of raw materials and thereafter adding other components. For preparing the superconductor of the present invention, preferred is a method which comprises previously synthesizing intimate mixed oxides or composite oxides by the above-mentioned method using oxides, nitrates, carbonates, halides, organic acid salts or organometallic complexes of barium (Ba), strontium (Sr), calcium (Ca), and copper (Cu) excluding thallium (Tl), then mixing therewith an oxide of thallium (Tl) and firing the mixture. Alternative preferred method is to form a film of the composition by a sputtering method, CVD method, vapor deposition method or flame spray coating method.

The prepared composition is fired at 950° C. or lower, whereby the superconductor of the present invention can be obtained. An atmosphere for firing is not critical as far as it contains a slight amount of oxygen. However, a plurality of superconductor crystal structures comprising the composition $Tl_m(Ba_{1-x}Sr_x)_2Ca_{n-1}Cu_nO_z$ (m=1 or 2, n≧1) are present in the superconductor of the present invention and when m is 1, 1.0≧x≧0.5 and when m is 2 and n is 3, 0.5≧ x>0. It may be a mixture of them. Equlibrium phase of these crystal phases is determined by a composition charged, firing temperature and oxygen partial pressure and hence in order to obtain a superconductor of a specific crystal structure, the composition charged, firing temperature and oxygen partial pressure within specific ranges are selected. For example, in order to obtain a superconductor of 100 K or higher, the composition is fired at 830°–900° C., preferably 850°–890° C. in air (oxygen partial pressure: 0.2 atm) in case of composition of n≧2.

If the molded body is fired as it is, Tl is evaporated to cause deviation in composition and no good superconducting properties can be obtained. Therefore, a suitable amount of a powder having the same composition as the molded body is sprinkled on a ceramic plate, thereon is put the molded body and a powder of the same composition is further sprinkled thereon so that the molded body is hidden by the powder. Then, this is covered by a vessel made of ceramics to enclose the whole therein. According to this method, the evaporated $TlO_2$ does not escape from the ceramic vessel and thus the inside of the vessel can be made thallium atmosphere in an easy manner. As a result, the deviation in composition is little and superconductors with good characteristics can be obtained. If necessary, opening between the ceramic plate and the vessel may be filled up with a silver paste, ceramic adhesive for high-temperature bonding, or the like to further enhance the effect.

The resulting sintered body was subjected to the X-ray powder diffractometry to find that it contained no heterogeneous phase and comprised nearly single phase and had a crystal structure comprising stacked perovskite units. In the case of the simple perovskite structure where copper (Cu) and thallium (Tl) are present in B site, no superconduction is exhibited, the superconductors of the present invention have a structure comprising two or more stacked perovskite units and especially those having a critical temperature of 100 K or higher have a structure comprising four or more stacked perovskite units.

When the microstructure of a superconductor having a critical temperature (Tc) of 100 K or higher was examined by a transmission electron microscope, only less than 5% of intergrowth of the low Tc phase of conventional Bi or Tl-Ba containing-superconductors having a Tc of lower than 100 K was observed. The sintered body comprised a layer perovskite structure comprising four or five $CuO_2$ layers sandwiched between Tl-O single or double layers. This is the phase which shows higher Tc than three $CuO_2$ layers. It is a cause for volume fraction of superconductor in the superconducting material being increased to 90 vol % or more that crystal grains of such high Tc phase are formed in the system where barium (Ba) and strontium (Sr) coexist.

The present invention is especially characterized by the method of producing a superconductor which comprises previously producing a dense mixed oxide or composite oxide using raw materials such as an oxide, nitrate, carbonate, halide, organic acid salt or organometallic complex of at least one element selected from barium and strontium, calcium element and copper element by the above-mentioned method and then absorbing thallium in gaseous phase into the mixed oxide or composite oxide.

Another method is to form the composition in the form of a film by sputtering, CVD, vapor deposition or flame spray coating wherein a film-like composition is formed from the raw materials such as an oxide, nitrate, carbonate, halide, organic acid salt or organometallic complex of at least one element selected from barium and strontium, calcium element and copper element and then thallium in gaseous phase is absorbed in the film. This method is effective for producing a film-like superconductor which is homogeneous, comprises a single layer and is high in volume fraction of superconductor.

The thus prepared composition is fired at a temperature of 950° C. or lower, whereby the superconductor of the present invention can be obtained. The atmosphere for firing is not critical as far as it contains a slight amount of oxygen. The superconductor of the present invention includes a plurality of superconducting crystal structures comprising the composition Tl-Sr-Ca-Cu-O or Tl-Ba-Sr-Ca-Cu-O and equilibrium phase of these crystal phases is determined depending on a temperature and oxygen partial pressure. Therefore, in order to obtain a superconductor of a specific crystal structure, temperature and oxygen partial pressure within specific ranges are selected. For example, for obtaining a superconductor of 100 K or higher, 840°–900° C. is most preferred in air (partial pressure of oxygen: –0.2 atm). However, this condition is not limitative and a temperature or oxygen partial pressure can be changed by adding to the composition at least one compound selected from lithium, potassium, sodium, cesium, rubidium, lead, etc. and replacing the components of the composition with these compounds. Generally, when these compounds are added to replace the components therewith, the synthesis temperature decreases depending on the addition and replacing amount of these compounds. Synthesis temperature can also be raised by enhancing an oxygen partial pressure. The effect of the present invention is not lost even when the above-mentioned components or other components are added in a slight amount for improving sinterability, stability, processability and others.

Methods for making the resulting oxide superconductor into wire include a plastic processing method which comprises charging a superconductor powder in a metallic pipe and drawing the pipe to make a fine wire, a method which comprises forming a film on a substrate by flame spray coating, CVD, sputtering, or vaper deposition and making tape-shaped wire, a melt quenching method which comprises liquefying a superconductor and coating this on a core, and tape casting method. Any of these methods can be employed. Explanation will be made with reference to the plastic processing method as an example.

A previously synthesized superconducting material is ground by a grinder or a ball mill to a mean particle size of several microns to several ten microns. The resulting powder is filled in a metallic pipe of 4–10 mm in diameter (for example, pipes made of gold, silver, silver-palladium alloy, and copper-nickel alloy) and this is drawn by a swager to make a wire of 1 mm or less in diameter. This is used as it is or further pressed by rolls into a tape and this is fired at 950° C. or lower to obtain a superconductor wire.

Since this firing results in sintering of a superconductor powder, it is preferred to carry out the firing after subjecting the wire to desired working such as working to coiled material or wiring. In this case, in order to enhance orientation of superconductor in a sheath material, it is effective to mill previously crystal grown grains to fine powder and apply shear force to the fine powders or to orient them by application of gravity or magnetic field. Furthermore, it is effective for promotion of sintering, improvement of crystal orientability and stabilization of crystal structure to add a slight amount of compound such as lithium, potassium, sodium, cesium, rubidium, lead, or the like.

An alternative method is as follow: Previously, a dense mixed oxide or composite oxide is prepared from raw materials such as an oxide, nitrate, carbonate, halide, organic acid salt or organometallic complex of at least one element selected from barium and strontium, calcium element and copper element by the aforementioned method, this is fired and then ground. The resulting powder is filled in a metallic pipe having a diameter of 4–10 mm and having gas diffusion pores (for example, pipes made of silver, a silver-palladium alloy and copper-nickel alloy) and this is drawn by a swager to make a wire of 1 mm or less in diameter. This wire per se or a tape-shaped wire made by further rolling the wire by rolls is fired at 950° C. or lower while diffusing thallium thereinto, whereby a superconductor wire material having such a crystal orientation that the c-axis of the oxide superconductor is normal to the face of the tapes can be obtained. In this case, the effect of the present invention can also be attained when the gas diffusion pores are provided after working into wire form or tape form.

Next, a method for preparation of a film-shaped oxide superconductor will be explained in detail. This method has already been referred to hereabove and film formation by a sputtering method will be explained as one example thereof.

Customary sputtering apparatuses can be used and there is no limitation. As target a sintered body of a mixed oxide of at least one element selected from strontium and barium, calcium element and copper element or a sintered body of mixed oxide of two or more components thereof and oxides of other components are used. Atmosphere for sputtering is preferably an inert gas such as argon or argon-oxygen. The resulting film-shaped composition is fired at 950° C. or lower in air or oxygen in accordance with the above-mentioned sintering method for superconductor, whereby a film-shaped oxide superconductor is obtained. Heating a substrate to 950° C. or lower at sputtering is an effective method because the subsequent firing step may not be needed in this case.

The resulting film-shaped composition is fired at 950° C. or lower in air or oxygen while diffusing thallium in gaseous phase thereinto in accordance with the above-mentioned sintering method for superconductor, whereby a film-shaped oxide superconductor is obtained. Heating a substrate to 950° C. or lower at sputtering is an effective method because the subsequent firing step may not be needed in this case.

Some methods for synthesis of oxide superconductors comprising oxides containing thallium, at least one element selected from strontium and barium, calcium, and copper at a temperature of 950° C. or lower have been explained hereabove. In order to obtain superconductors having high critical temperatures, it is important that the composition thereof is as specified in the present invention and a mixed oxide of at least one element selected from strontium and barium, calcium, and copper excluding thallium is fired while diffusing thallium in gaseous phase into the mixed oxide. It is also important to mix the raw materials homogenously and to select an optimum firing temperature and oxygen partial pressure. As far as these can be attained, there are no limitations in the method.

According to the present invention, when the Ba site of a TlBaCaCuO superconductor is gradually replaced with Sr, change is seen in crystal structure depending on the compositional ratio Sr/Ba. Furthermore, a single phase of high-temperature superconductor can be formed with high volume fraction by homogeneously mixing raw materials in the composition of the present invention and by the preparation method of the present invention and selecting a firing temperature and devising the firing method. Moreover, wires or films superior in homogeneity can be produced by using the materials of the present invention. As a result, the resulting wires and films have a high current density.

The present invention will be explained in detail by the following examples.

Example 1

Powders of strontium carbonate ($SrCO_3$), barium carbonate ($BaCO_3$), calcium carbonate ($CaCO_3$), and copper oxide (CuO) were weighed so as to obtain molar ratios of Sr:Ba:Ca:Cu=0.4:1.6:2:3, 0.8:1.2:2:3, 1:1:2:3, 1.2:0.8:2:3, and 1.6:0.4:2:3 and milled and mixed in a mortar made of agate of a grinder for about 30 minutes. The resulting powder was taken in a crucible of magnetic alumina and fired at 900° C. for 10 hours in air. The fired body was again milled and mixed in a mortar made of agate of a grinder for about 30 minutes. The powder was mixed with thallium oxide weighed so as to obtain Tl=2 in molar ratio for 30 minutes by a grinder. About 4 g of the resulting powder was press molded into a molded body of 30 mm in diameter. This molded body was placed in an alumina crucible and the crucible was covered by an alumina plate and the molded body therein was fired at 870° C. for 3 hours in air. A rod sample of 15 mm×5 mm×1 mm was cut out from the resulting sintered body and four terminals were connected thereto by indium solder and a change of an electric resistance with temperature was measured by a four-terminal resistance method using liquid nitrogen as refrigerant. The results are shown in FIG. 1. It can be seen that the critical temperature sharply changed at the point of Sr:Ba=1:1. Furthermore, a change of inductance with temperature of this sintered body was measured by an alternating current method and the volume fraction of superconductor in this sintered body was measured using as a standard the change of inductance based on the superconducting transition of lead. The results are shown in Table 1.

TABLE 1

| Composition (Tl:Sr:Ba:Ca:Cu) | Volume fraction (%) at 90K |
| --- | --- |
| 2:0.4:1.6:2:3 | 99.9 |
| 2:0.8:1.2:2:3 | 99.8 |
| 2:1:1:2:3 | 99.7 |
| 2:1.2:0.8:2:3 | 99.7 |
| 2:1.6:0.4:2:3 | 99.8 |

Figure 2:
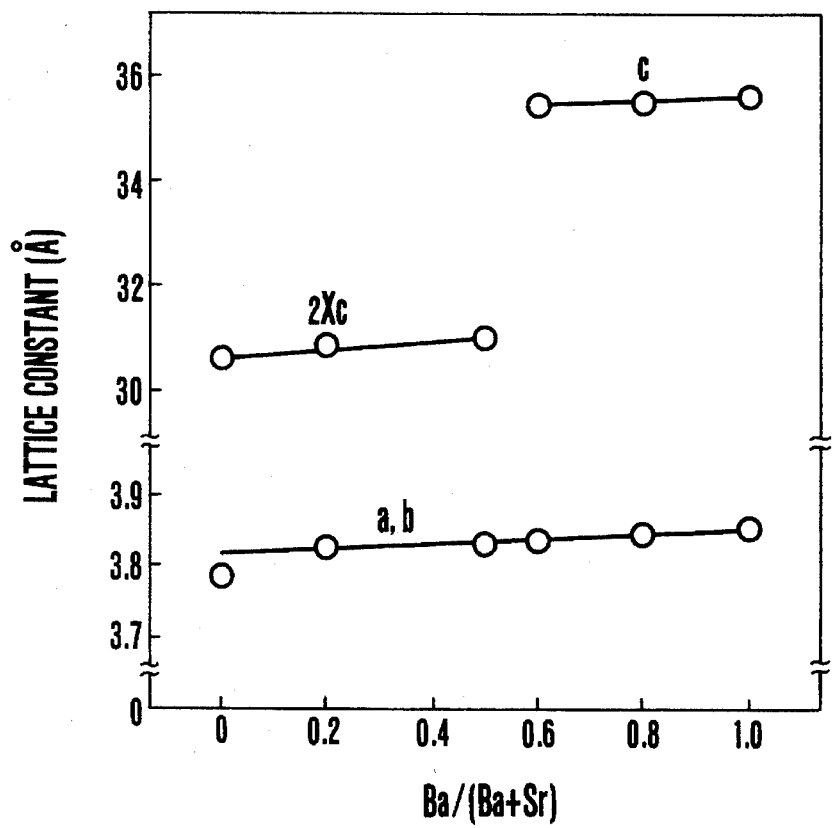
FIG. 2 is a graph which shows a relation between lattice constant of crystal and compositional ratio Sr/Ba.
Figure 3B:
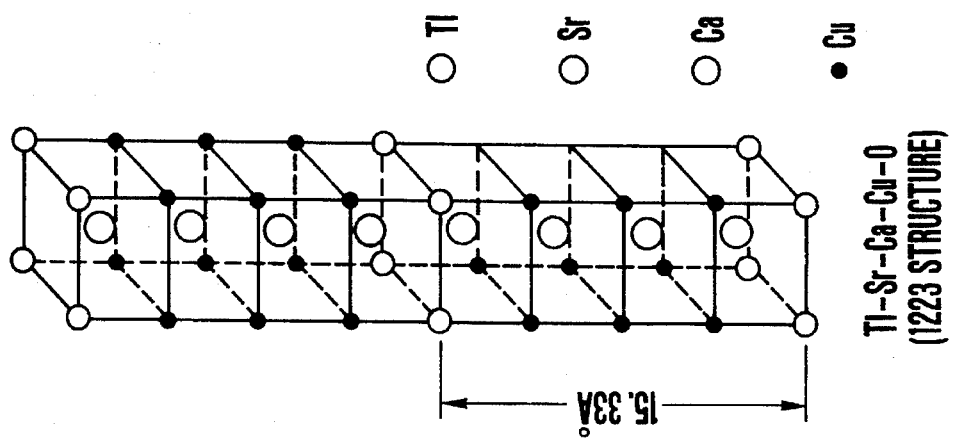
FIG. 3(a) and FIG. 3(b) show models of crystal structures where Sr is present in a larger amount and Ba is present in a larger amount, respectively.
Figure 3A:
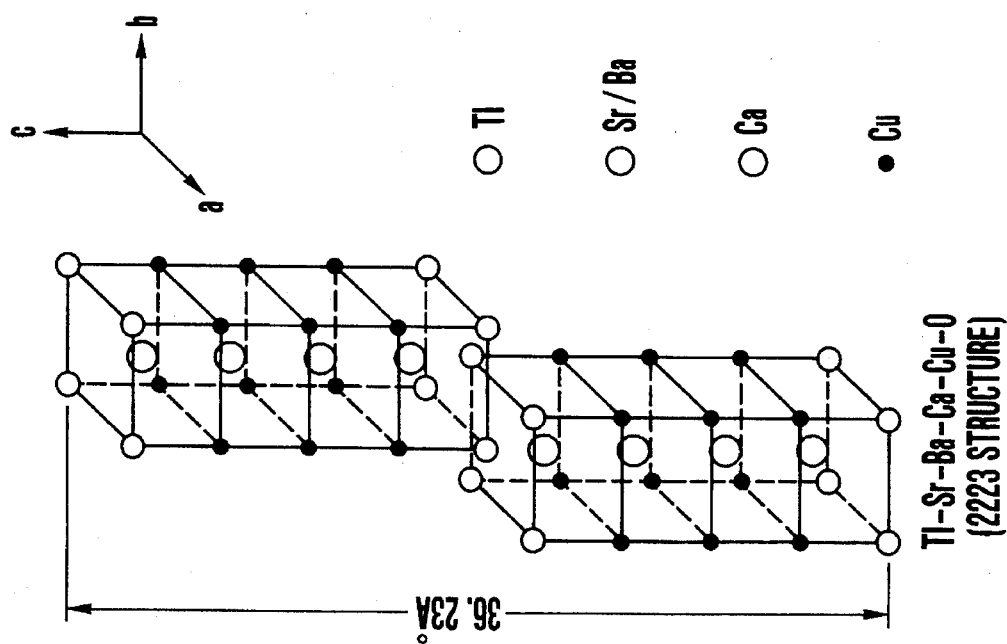

Respective samples were subjected to X-ray powder diffractometry. Analysis of diffraction pattern showed the change of lattice constant with change in composition as shown in FIG. 2. That is, as shown in FIG. 3(b), on the side where Sr was present in a large amount, it had a layer perovskite structure comprising three $CuO_2$ layers sandwiched between single Tl-O layers with lattice constants a, b=3.77–3.83 and c=15.25–15.5 Å, namely, a crystal structure comprising four rectangular parallelopiped perovskite units composed of B site ions of Tl and Cu. As shown in FIG. 3(a), on the side where Ba was present in a large amount, the sample had a crystal structure comprising three $CuO_2$ layers sandwiched between double Tl-O layers with lattice constants a, b=3.83–3.85 and c=35.4–35.6 Å.

Figure 4A:
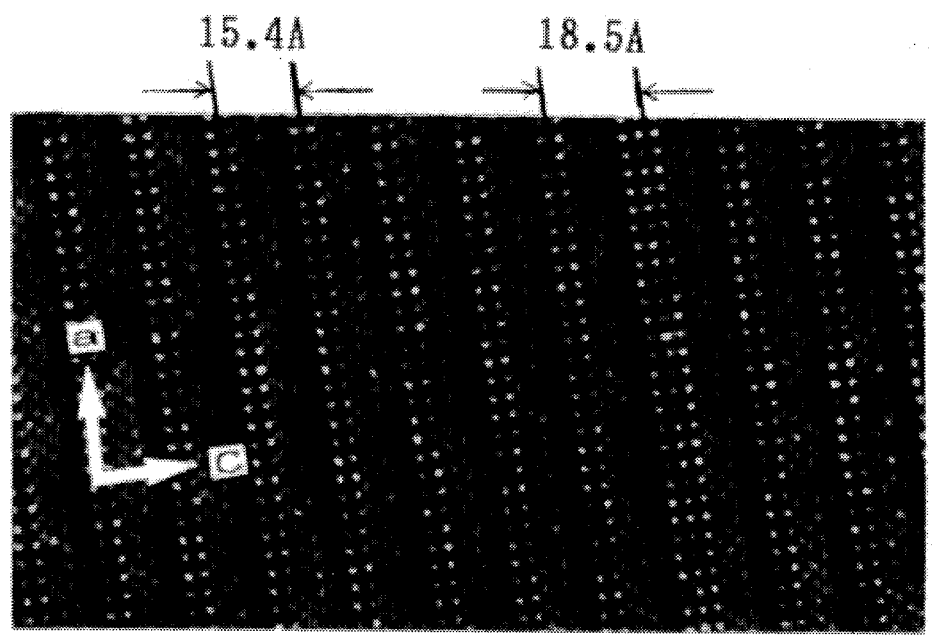
FIG. 4(a) is a transmission electron micrograph of crystal structure of the sample $Tl_1Sr_{1.6}Ba O_{0.4}Ca_2Cu_3O_x$ obtained in Example 1
Figure 4B:
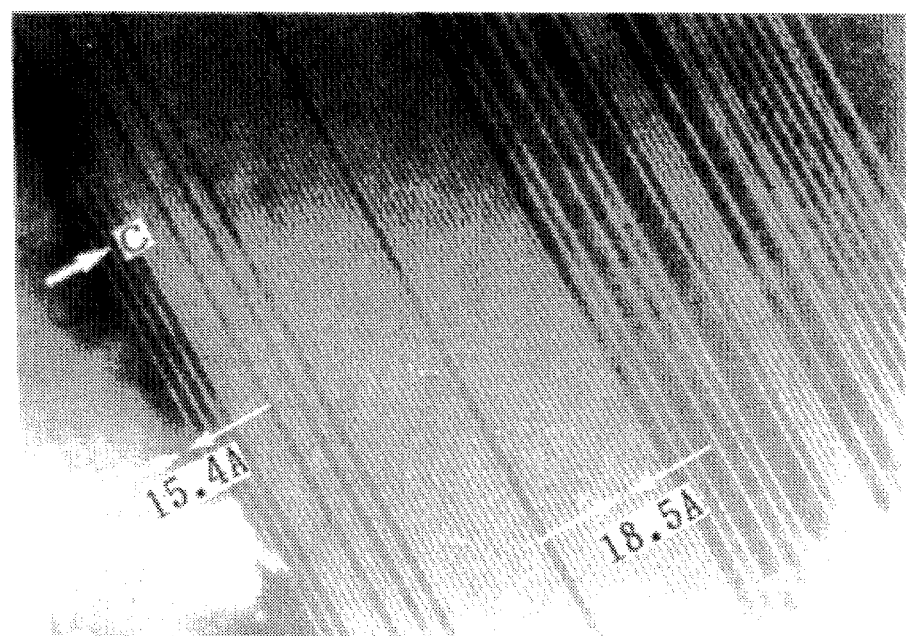
FIG. 4(b) is a transmission electron micrograph of a crystal structure of Bi-Sr-Ca-Cu-O superconductor prepared by a conventional method. In these Figures, arrows a and c indicate directions of axes a and c of crystal grains, respectively.

Among the samples, the transmission electron microscope (TEM) image of a sample prepared at a molar ratio Sr:Ba=1.6:0.4 is shown in FIG. 4(a). For comparison, the TEM image of crystal structure of a Bi-Sr-Ca-Cu-O sintered body prepared by a conventional method is shown in FIG. 4(b). In these FIGS. 4(a) and 4(b), lattice images based on periodicity of c-axis are observed, respectively. FIG. 4(b) shows intergrowth of lattice image of about 15.4 Å in spacing (corresponding to ½ of length of axis c) which shows a low Tc phase with lattice image of about 18.5 Å in spacing (corresponding to ½ of length of axis c) which shows a high Tc phase. On the other hand, it is recognized in FIG. 4(a) that a phase (about 18.5 Å) having a longer length of axis c which shows high Tc is present in nearly a homogeneous high Tc phase (about 15.4 Å in spacing) of single Tl-O layer. Here, the high Tc phase has a crystal structure comprising four perovskite units and the phase having a longer length of axis c has a crystal structure comprising five perovskite units.

Example 2

The composition Tl:Sr:Ba:Ca:Cu=2:0.4:1.6:2:3 was selected from the compositions used in Example 1 and 6 molded bodies were prepared therefrom in the same manner as in Example 1. These 6 molded bodies were fired for 3 hours in air at 810° C., 830° C., 850°, 870° C. 890° C., and 910° C. For these sintered bodies, the change of electric resistance with time was measured in the same manner as in Example 1. The sample fired at 910° C. was molten and was an oxide of high resistance. The results are shown in Table 2.

TABLE 2

| Firing temperature (°C.) | 810 | 830 | 850 | 870 | 890 | 910 |
|---|---|---|---|---|---|---|
| Critical temperature (K) (onset) | 75 | 99 | 107 | 125 | 110 | — |

Example 3

The raw materials were mixed and fired to obtain the same Sr, Ba, Ca, and Cu ratio as in Example 1. The resulting fired body was milled in a mortar made of agate of a grinder for 30 minutes. The powder was mixed with $Tl_2O_3$ weighed so as to obtain Tl=1 in molar ratio by a grinder for 30 minutes. The resulting powder was molded in the same manner as in Example 1 and the molded body was fired at 890° C. for 3 hours in air. For the resulting sintered body, the change of electric resistance with temperature was measured in the same manner as in Example 1. The results are shown in Table 3. Crystal structure of superconductor was examined by X-ray powder diffractometry to find that the lattice constant showed changes with composition as shown in FIG. 2. That is, with respect to the ratio Sr/Ba, on the side where Sr was present in a large amount, the crystal structure was a layer perovskite structure comprising three $CuO_2$ layers sandwiched between single Tl-O layers and on the side where Ba was present in a large amount, it was a layer perovskite structure comprising four $CuO_2$ layers sandwiched between double Tl-O layers. Furthermore, the change of inductance with temperature of this sintered body was measured by alternating current method and volume fraction of superconductor in this sintered body determined using as a standard the change in inductance based on superconducting transition of lead is also shown in Table 3.

TABLE 3

| Composition (Tl:Sr:Ba:Ca:Cu) | Critical temp. (Resistance zero) | Volume fraction (%) at 77K |
|---|---|---|
| 1:0.4:1.6:2:3 | 98 | 59.7 |
| 1:0.8:1.2:2:3 | 96 | 58.5 |
| 1:1:1:2:3 | 93 | 98.9 |
| 1:1.2:0.8:2:3 | 94 | 99.3 |
| 1:1.6:0.4:2:3 | 96 | 99.6 |

Example 4

Figure 5:
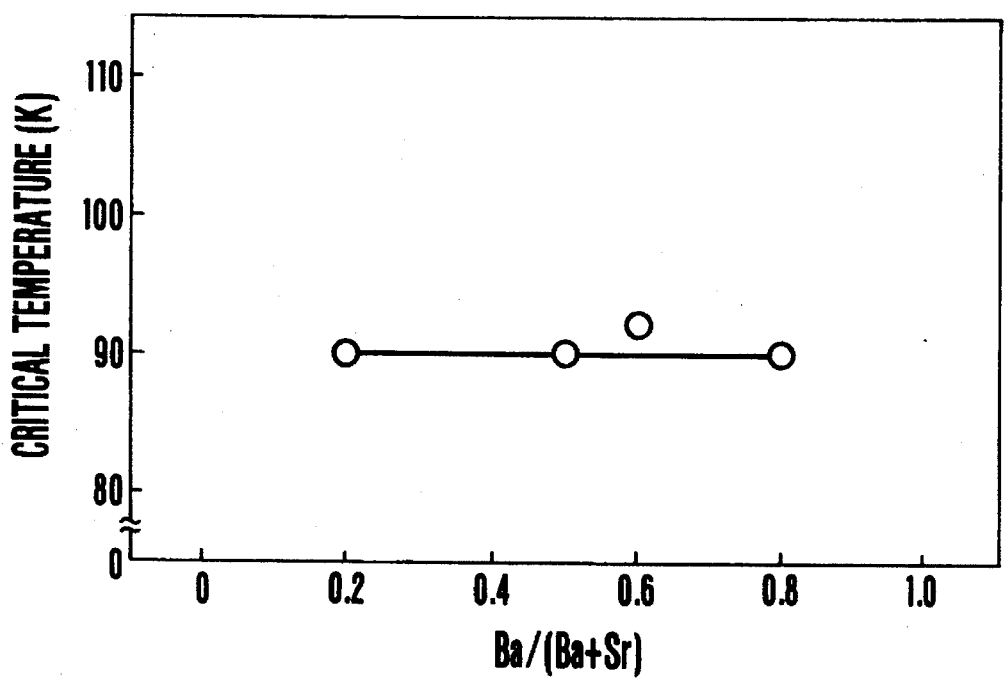
FIG. 5 is a graph which shows a relation between the critical temperature and compositional ratio Sr/Ba of the sintered body obtained in Example 4.

In the same manner as in Example 1, molded bodies were prepared which had the ratios Tl:Sr:Ba:Ca:Cu =2:0.4:1.6:1:2, 2:0.8:1.2:1:2, 2:1:1:1:2, 2:1.2:0.8:1:2, and 2:1.6:0.4:1:2. These molded bodies were fired at 890° C. for 3 hours in air. Columnar samples of 15 mm ×5 mm×1 mm were cut out from these sintered bodies and for these samples, the change of electric resistance with temperature was measured in the same manner as in Example 1. The results are shown in FIG. 5.

Figure 6:
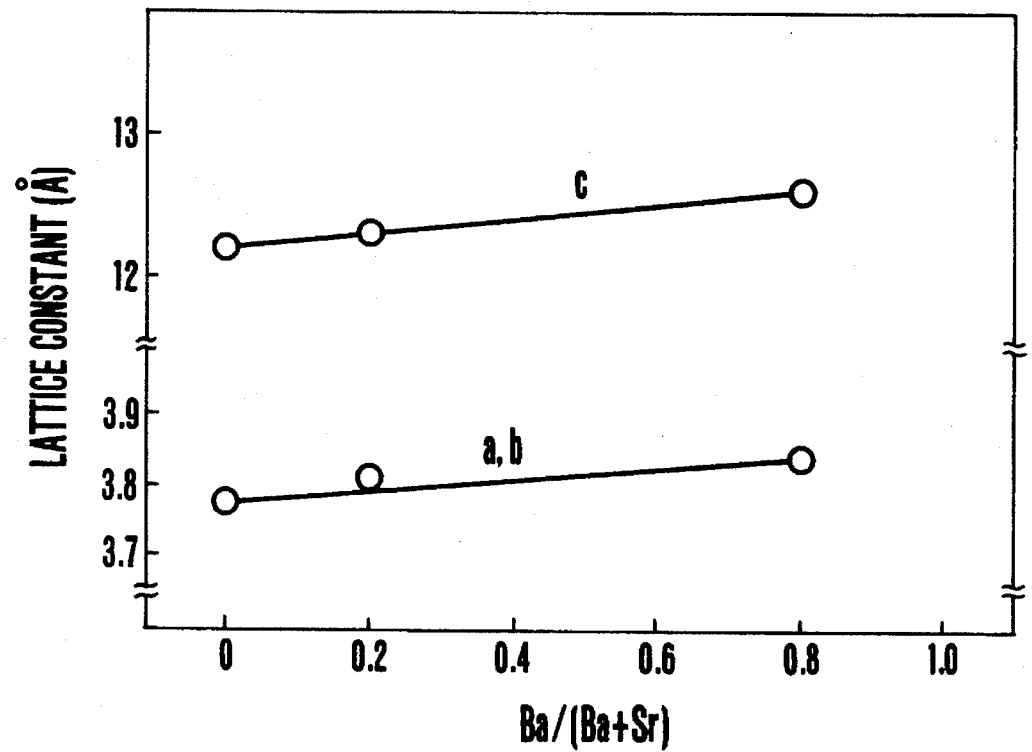
FIG. 6 is a graph which shows a relation between a lattice constant c of crystal and compositional ratio Sr/Ba.

They were subjected to X-ray powder diffractometry to examine the crystal structure of superconductor. Lattice constant is shown in FIG. 6. The change of lattice constant with change of composition as shown in FIG. 2 was not seen and the crystal structure was a layer perovskite structure comprising two $CuO_2$ layers sandwiched between single Tl-O layers with a, b= 3.77–3.74 (Å) and c=12.2–12.6 (Å), that is, a crystal structure comprising three rectangular parallelopiped perovskite unit composed of B site ions comprising Tl and Cu.

Example 5

Figure 7:
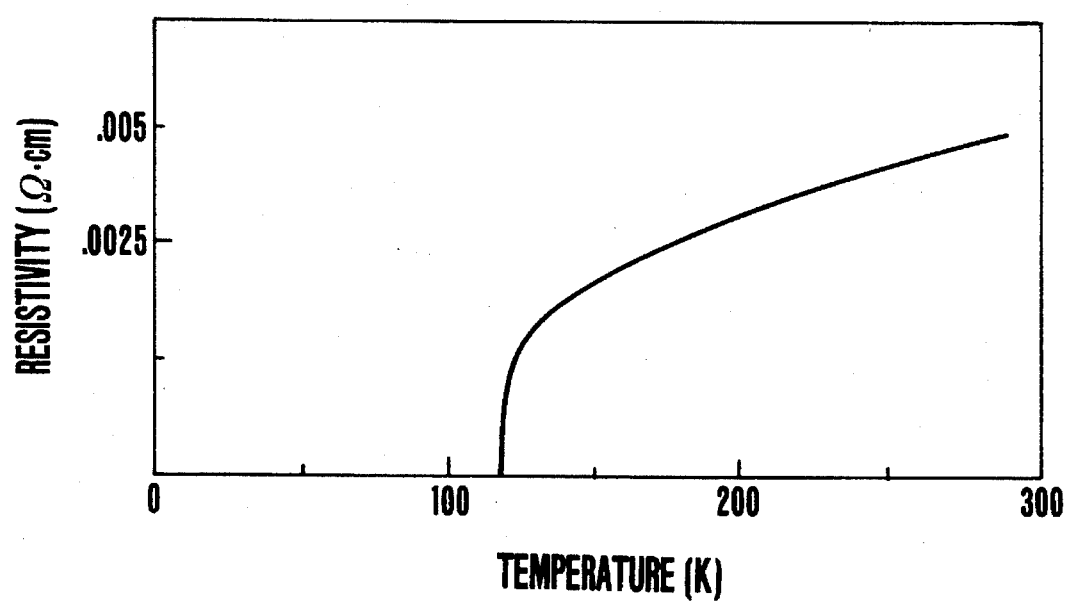
FIG. 7 is a graph which shows a change of electrical resistance with temperature of the sintered body obtained in Example 5.
Figure 8:
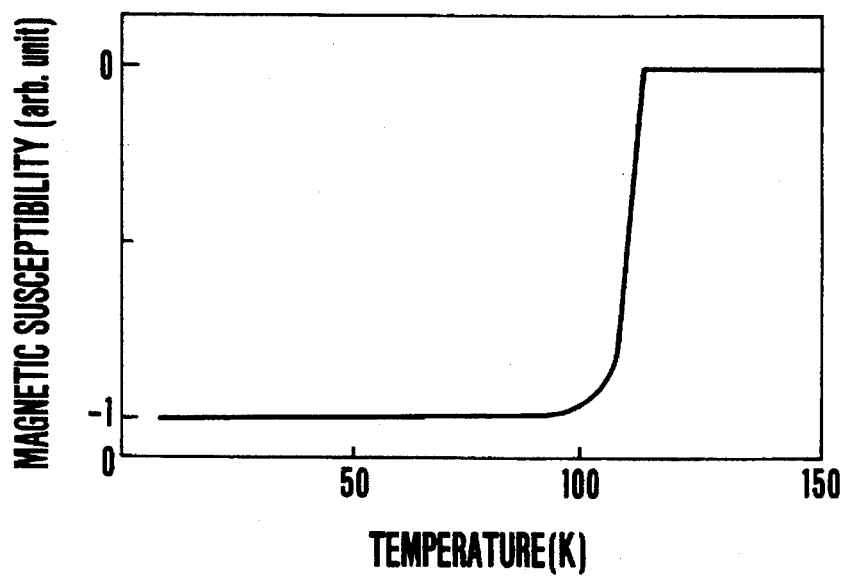
FIG. 8 is a graph which shows a change of magnetic susceptibility with change of temperature.

Raw materials were weighted so as to obtain Sr:Ba:Ca:Cu=0.4:1.6:2:3 and mixed in an agate mortar of a grinder for 30 minutes. The resulting mixed powder was taken in a magnetic alumina crucible and fired at 900° C. for 10 hours in air. The fired body was again milled in the agate mortar of a grinder for about 30 minutes and was further mixed with $Tl_2O_3$ weighed so as to obtain Tl=2 in molar ratio for 30 minutes. About 5 g of the obtained powder was press molded into a molded body of 30 mm in diameter. This molded body was put on a powder having the same composition as the molded body which was sprinkled on an alumina plate. Furthermore, a powder of the same composition as that of the molded body was sprinkled thereon so as to hide the molded body. An alumina crucible was put thereon so that it covered the whole. The opening between the crucible and the plate was filled up with a silver paste and this was kept at 400° C. for 2 hours and fired at 870° C. for 3 hours. For the resulting sintered body, the change of electric resistance with time was measured in the same manner as in Example 1. As shown in FIG. 7, the critical temperature at onset was 123 K and the electric resistance became zero at 116 K. Further, the change of inductance with temperature of this sintered body was measured by alternating current method and the results are shown in FIG. 8. The volume fraction of superconductor of this sintered body which showed a critical temperature of 110 K was obtained using as a standard the change in inductance based on the superconducting transition of lead. It was 99.9% or more.

Example 6

SrO: 1.66 g, BaO: 9.82 g, CaO: 4.49 g, and CuO: 9.54 g were milled and mixed in an agate mortar of a grinder for 30 minuts. The resulting powder was put in a magnetic alumina crucible and fired at 900° C. for 10 hours. The fired body was again milled in the agate mortar of a grinder for about 30 minutes. The resulting powder was press molded into pellets of 30 mm in diameter and of 4 g each. The resulting pellets were fired at 890° C. for 5 hours in air. Using these pellets as a target, a film-shaped composition was produced on an MgO single crystal substrate of 15 mm×5 mm by a sputtering method. Plane (001) of an MgO single crystal was used as the substrate. The sputtering was carried out at an accelerating voltage of 2 kV in an atmosphere of 40% oxygen diluted with argon under $1×10^{-2}$ torr. Thickness of the resulting film was about 1 μm. Separately, 18.27 g of $Tl_2O_3$ was press molded into a pellet, which was then fired at 600° C. for 3 hours. This pellet and each of the two film-shaped compositions obtained above were put in an alumina crucible so that these did not contact each other and covered by an alumina plate and fired at 840° C. for 3 hours in air. The thus obtained film-shaped composition was an oxide having an atomic ratio of Tl:Sr:Ba:Ca:Cu= 2:0.4:1.6:2:3. Four terminals were connected to one film-shaped composition by a silver paste and the change of electric resistance with change in temperature was measured by a four-terminal resistance method with liquid nitrogen as a refrigerant. As a result, critical temperature at onset was 115 K and the electric resistance became zero at 110 K. Another one of the film-shaped composition was subjected to pattern etching so that the central portion had a width of 0.1 mm and four terminals were connected to both ends with a silver paste. Current-voltage characteristics were measured by a direct current method. Critical current density at the temperature of liquid nitrogen when a detection terminal voltage was 1 μV/cm was 750,000 A/cm$^2$.

Example 7

Five pellets of the oxide superconductor prepared in Example 5 were milled for 30 minutes by a grinder and then further milled for 1 hour in an agate mortar. The resulting powder of 3–5 μm in mean particle diameter was filled in a silver pipe of 6 mm in diameter and this was drawn by a draw bench to a diameter of 1.8 mm to obtain a tape-shaped product. This tape-shaped molded body was cut to 25 mm in length and fired at 860° C. for 5 hours in an oxygen stream. Four terminals were connected to this sample with an indium solder and current-voltage characteristics were measured by a direct current four-terminal resistance method. The critical current density at the temperature of liquid nitrogen when a detection terminal voltage was 1 μV/cm was 17,500 A/cm$^2$.

Example 8

BaCO$_3$: 3.95 g, SrCO$_3$: 2.95 g, CaCO$_3$: 6.00 g, and CuO: 6.36 g were dry-mixed in a ball mill for about 1 hour. The resulting powder was put in a magnetic alumina crucible and fired at 870° C. for 15 hours in air. The resulting sintered body was again milled in an agate mortar of a grinder for about 30 minutes. To this powder was added 9.31 g of Tl$_2$O$_3$, followed by mixing for about 1 hour in a ball mill. The resulting powder was press molded into a pellet of 30 mm in diameter and of 4 g each. This pellet was fired at 850° C. for 3 hours in air. This sintered body was observed by TEM to find that about 22% or more of crystallites were constituted of a crystal phase having a lattice crystal c of 18.5 Å.

Example 9

SrCO$_3$: 5.90 g, CaCO$_3$: 4.00 g, and CuO: 4.77 g were milled and mixed in an agate mortar of a grinder for about 30 minutes. The resulting powder was put in a magnetic alumina crucible and fired at 900° C. for 15 hours. The fired body was again milled in an agate mortar of a grinder for about 30 minutes. The resulting powder was press molded into a pellet of 30 mm in diameter and of 4 g. Separately, 12.0 g of Tl$_2$O$_3$ was press molded into a pellet of 30 mm in diameter and of 4 g. The pellet of Sr-Ca-Cu-O and the pellet of Tl$_2$O$_3$ were placed in an alumina crucible so that these two pellets did not contact each other and the crucible was covered with an alumina plate, followed by firing at 850° C. for 3 hours in air. The resulting pellet was an oxide having an atomic ratio of Tl:Sr:Ca:Cu=1:2:2:3. A columnar piece of 15 mm×5 mm×1 mm was cut out from this pellet. Four terminals were connected to this piece with an indium solder and the change of electric resistance with change in temperature by a four-terminal resistance method with liquid nitrogen as a refrigerant. As a result, the critical temperature at onset was 108 K and electric resistance became zero at 101 K. Furthermore, for this sintered body, the change of inductance with temperature was measured by an alternating current method and the volume fraction of superconductor of this sintered body which showed a critical temperature of 108 K was obtained using as a standard the change in inductance based on superconducting transition of lead. This was 90.3%. Moreover, this superconductor sample was subjected to X-ray powder diffractometry to examine crystal structure. It was found that the sample had a layer perovskite structure comprising three CuO$_2$ layers sandwiched between single Tl-O layers with lattice constants of c=15.6 and a=b=3.79 Å.

Example 10

Five pellets prepared in the same manner as in Example 9 were fired at 820° C., 840° C., 860° C., 880° C., 900° C., and 950° C. for 3 hours in air. For these pellets, the change of electric resistance with temperature was measured in the same manner as in Example 9. Further, the volume ratio of superconductor which showed a critical temperature of 108 K was obtained in the same manner as in Example 9. The results are shown in Table 4. The sample fired at 950° C. was molten and was an oxide of high resistance.

TABLE 4

| Firing temperature (°C.) | 820 | 840 | 860 | 880 | 900 |
|---|---|---|---|---|---|
| Critical temp. (K) (Resistance zero) | 55 | 60 | 101 | 60 | 45 |
| Volume fraction (%) | 0 | 83.8 | 90.7 | 15.6 | 5 |

Example 11

BaCO$_3$: 6.32 g, SrCO$_3$: 1.18 g, CaCO$_3$: 4.00 g and CuO: 4.77 g were milled and mixed in an agate mortar of a grinder for about 30 minutes. The resulting powder was put in a magnetic alumina crucible and fired at 900° C. for 15 hours. The fired body was again milled in an agate mortar of a grinder for about 30 minutes. The resulting powder was press molded into a pellet of 30 mm in diameter and of 4 g. Separately, 12.0 g of Tl$_2$O$_3$ was milled for about 30 minutes by a grinder and 4 g of the powder was press molded into a pellet of 30 mm in diameter. These two kinds of pellets were placed in an alumina crucible so that these two pellets did not contact each other and the crucible was covered with an alumina plate, followed by firing at 850° C. for 3 hours in air. The resulting pellet was an oxide having an approximate atomic ratio of Tl:Ba:Sr:Ca:Cu= 2:1.6:0.4:2:3. A columnar piece of 15 mm×5 mm×1 mm was cut out from this pellet. Four terminals were connected to this piece with an indium solder and the change of electric resistance with change in temperature was measured by four-terminal resistance method with liquid nitrogen as a refrigerant. As a result, the critical temperature at onset was 123 K and electric resistance became zero at 117 K. Furthermore, for this sintered body, the change of inductance with temperature was measured by an alternating current method and the volume fraction of superconductor of this sintered body which showed a critical temperature of 117 K was obtained using as a standard the change in inductance based on the superconducting transition of lead. This was 99.9%.

Example 12

In the same manner as in Example 11, two samples were prepared so as to have Tl:Ba:Sr:Ca:cu= 1:0.20:1.80:2:3, 1:0.40:1.60:2:3, 1:0.6:1.4:2:3, 1.0:1.2:0.8:2:3, 1:1:1:2:3, 2:1:1:2:3, 2:1.2:0.8:2:3, 2:1.4:0.6:2:3, 2:1.6:0.4:2:3, and 2:1.8:0.2:2:3. These pellets were fired at 850° C. for 5 hours in air. In the same manner as in Example 9, for sample pieces made from these pellets, the change of electric resistance with temperature was measured. The results are shown in Table 5 together with the results obtained in Examples 9 and 11.

TABLE 5

| Composition | | | | | Critical temperature (K, resistance zero) | Volume fraction |
|---|---|---|---|---|---|---|
| (Tl: | Ba: | Sr: | Ca: | Cu) | | (% at 77K) |
| 1 | 0 | 2 | 2 | 3 | 101 | 90.3 |
| 1 | 0.20 | 1.80 | 2 | 3 | 98 | 99.5 |
| 1 | 0.40 | 1.60 | 2 | 3 | 96 | 99.7 |
| 1 | 0.60 | 1.40 | 2 | 3 | 95 | 99.7 |
| 1 | 0.80 | 1.20 | 2 | 3 | 94 | 99.8 |
| 1 | 1 | 1 | 2 | 3 | 93 | 99.6 |
| 2 | 1 | 1 | 2 | 3 | 108 | 99.9 |
| 2 | 1.20 | 0.80 | 2 | 3 | 112 | 99.8 |
| 2 | 1.40 | 0.60 | 2 | 3 | 115 | 99.9 |
| 2 | 1.60 | 0.40 | 2 | 3 | 117 | 99.9 |
| 2 | 1.80 | 0.20 | 2 | 3 | 119 | 99.8 |

Figure 9:
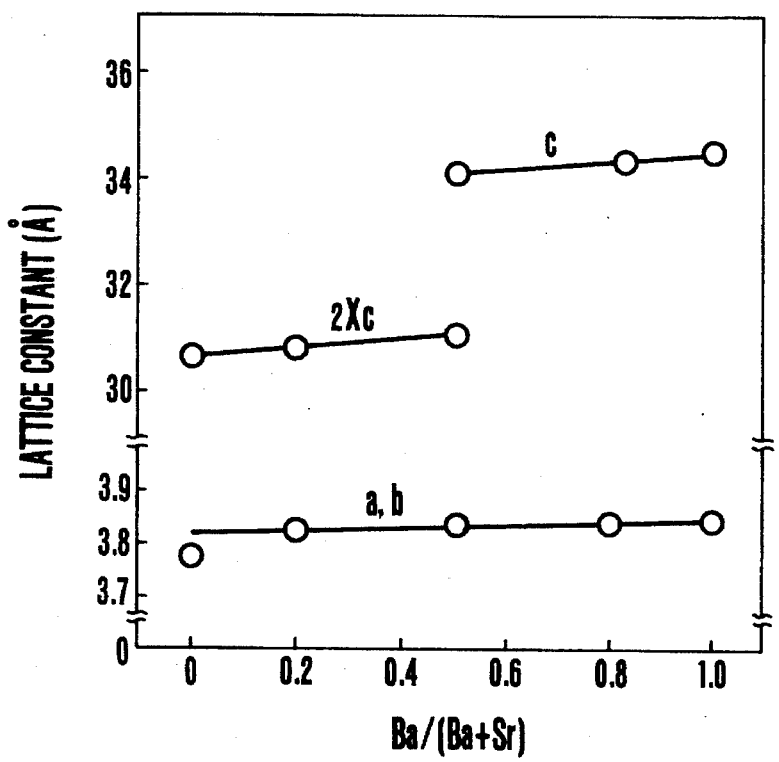
FIG. 9 is a graph which shows the lattice constant of crystal of superconducting phase of Tl-Sr-Ba-Ca-Cu-O in the level of 100–120 K of the present invention.

The thus obtained superconductors were subjected to X-ray powder diffractometry to examine the crystal structure. Analysis showed the change of lattice constant with change in composition as shown in FIG. 9. That is, with reference to Sr/Ba ratio, in the composition containing a larger amount of Sr, the structure was a layer perovskite structure comprising three $CuO_2$ layers sandwiched between single Tl-O layers and in the composition containing a larger amount of Ba, the structure was a layer perovskite structure comprising three $CuO_2$ layers sandwiched between double Tl-O layers.

Example 13

The two kinds of pellets Tl-O and Sr-Ca-Cu-O prepared and molded as in Example 9 were enclosed in an alumina container of 100 ml in volume and of a 3% oxygen atmosphere diluted with argon and this container was placed in an electric furnace of 3% oxygen atmosphere diluted with argon to carry out firing at 820° C. for 5 hours. From the thus obtained sample, a columnar piece of 15 mm×5 mm×1 mm was cut out in the same manner as in Example 9. Four terminals were connected thereto with an indium solder and the change of electric resistance with temperature was measured by a four-terminal resistance method using liquid nitrogen as a refrigerant. The critical temperature at onset was 120 K and electric resistance became zero at 105 K. The change of this sintered body with temperature was measured by an alternating current method and the volume fraction of superconductor of the sintered body which showed a critical temperature of 108 K was obtained using as standard the change in inductance based on the superconducting transition of lead. It was 95.6%.

Example 14

$SrCO_3$: 11.8 g, $CaCO_3$: 8.0 g, and CuO: 9.6 g were milled and mixed in an agate mortar of a grinder for 30 minutes. The resulting powder was put in a magnetic alumina crucible and fired at 900° C. for 20 hours. The fired body was again milled in an agate mortar of a grinder for about 30 minutes. 10 g of the resulting powder was press molded into a pellet of 40 mm in diameter. The resulting pellet was fired at 900° C. for 5 hours in air. Using this pellet as a target, a film-shaped composition was produced on an MgO single crystal substrate of 20 mm×5 mm by a sputtering method. Plane (001) of the MgO single crystal was used as the substrate. The sputtering was carried out at an accelerating voltage of 2 kV in an atmosphere of 40% oxygen diluted with argon under $1\times10^{-2}$ torr. Thickness of the resulting film was about 1 μm. Separately, 10 g of $Tl_2O_3$ was press molded into a pellet, which was then fired at 650° C. for 3 hours. This pellet and each of the two film-shaped compositions obtained above were put in an alumina crucible so that these did not contact each other and covered by an alumina plate and fired at 850° C. for 3 hours in air. The thus obtained film-shaped composition was an oxide having an approximate atomic ratio of Ti:Sr:Ca:Cu= 1:2:2:3. Four terminals were connected to one film-shaped composition by a silver paste and the change of electric resistance with change in temperature was measured by a four-terminal resistance method with liquid nitrogen as a refrigerant. As a result, the critical temperature at onset was 115 K and electric resistance became zero at 103 K. Another one of the film-shaped composition was subjected to pattern etching so that the central portion had a width of 0.1 mm and four terminals were connected to both ends with silver paste. Current-voltage characteristics were measured by a direct current method. The critical current density at the temperature of liquid nitrogen when a detection terminal voltage was 1 μV/cm was 11,000 $A/cm^2$.

Example 15

$BaCO_3$: 6.32 g, $SrCO_3$: 1.18 g, $CaCO_3$: 4.00 g and CuO: 4.77 g were milled and mixed in an agate mortar of a grinder for 30 minutes. The resulting powder was put in a magnetic alumina crucible and fired at 900° C. for 15 hours. The fired body was again milled in an agate mortar of a grinder for about 30 minutes. 10 g of the resulting powder was press molded into pellets of 30 mm in diameter and of 4 g each. The resulting pellets were fired at 900° C. for 5 hours in air. Using this pellet as a target, a film-shaped composition was produced on an MgO single crystal substrate of 20 mm×5 mm by a sputtering method. Plane (001) of the MgO single crystal was used as the substrate. The sputtering was carried out at an accelerating voltage of 2 kV in an atmosphere of 40% oxygen diluted with argon under $1\times10^{-2}$ torr. The thickness of the resulting film was about 1 μm. Separately, 10 g of $Tl_2O_3$ was press molded into a pellet, which was then fired at 650° C. for 3 hours. This pellet and each of the two film-shaped compositions obtained above were put in an alumina crucible so that these did not contact each other and covered by an alumina plate and fired at 850° C. for 3 hours in-air. The thus obtained film-shaped composition was an oxide having an atomic ratio of Ti:Sr:Ba:Ca:Cu= 2:0.40:1.60:2:3. Four terminals were connected to one film-shaped composition by a silver paste and the change of electric resistance with change in temperature was measured by a four-terminal resistance method with liquid nitrogen as a refrigerant. As a result, the critical temperature at onset was 119 K and electric resistance became zero at 105 K. Another one of the film-shaped composition was subjected to pattern etching so that the central portion had a width of 0.1 mm and four terminals were connected to both ends with silver paste. The current-voltage characteristics were measured by a direct current method. The critical current density at the temperature of liquid nitrogen when a detection terminal voltage was 1 μV/cm was 950,000 $A/cm^2$.

Example 16

Five pellets of the oxide superconductor prepared in Example 11 were milled for 1 hour by an agate ball mill. The resulting powder of 3–5 μm in mean particle diameter was filled in a silver pipe of 6 mm in diameter and this was drawn by a drawbench to a diameter of 1.8 mm to obtain a wire-shaped molded body having a silver sheath. This was rolled to thickness of 0.1 mm by a rolling mill to obtain a tape-shaped molded body. This tape-shaped molded body was cut to 25 mm in length and fired at 860° C. for 5 hours in oxygen stream. Four terminals were connected to this sample with indium solder and the current-voltage characteristics were measured by a direct current four-terminal resistance method. The critical current density at the temperature of liquid nitrogen when a detection terminal voltage was 1 μV/cm was 19,500 A/cm$^2$.

Example 17

$SrCO_3$: 5.90 g, $CaCO_3$: 2.00 g, and CuO: 3.18 g were milled and mixed in an agate mortar of a grinder for about 30 minutes. The resulting powder was put in a magnetic alumina crucible and fired at 900° C. for 15 hours. The fired body was again milled in an agate mortar of a grinder for about 30 minutes. The resulting powder was press molded into pellets of 30 mm in diameter and of 4 g each. Separately, 12.0 g of $Tl_2O_3$ was press molded into pellets of 30 mm in diameter and of 4 g each. The pellet of Sr-Ca-Cu-O and the pellet of $Tl_2O_3$ were placed in an alumina crucible so that these two pellets did not contact each other and the crucible was covered with an alumina plate, followed by firing at 890° C. for 24 hours in air. The resulting pellet was an oxide having an approximate atomic ratio of Tl:Sr:Ca:Cu =1:2:1:2. A columnar piece of 15 mm×5 mm×1 mm was cut out from this pellet. Four terminals were connected to this piece with an indium solder and the change of electric resistance with change in temperature was measured by four-terminal resistance method with liquid nitrogen as a refrigerant. As a result, the critical temperature at onset was 83 K and electric resistance became zero at 78 K. Furthermore, for this sintered body, the change of inductance with temperature was measured by an alternating current method and the volume fraction of superconductor in this sintered body which showed an electric resistance of 0 at a critical temperature of 78 K was obtained using as a standard the change in inductance based on the superconducting transition of lead. This was 95.3%. Moreover, this superconductor sample was subjected to X-ray powder diffractometry to examine the crystal structure. It was found that the sample had a layer perovskite structure comprising two $CuO_2$ layers sandwiched between single Tl-O layers with lattice constants of c=12.1 and a=b=3.79 Å.

Example 18

Five pellets prepared in the same manner as in Example 9 were fired at 820° C., 840° C. 860° C. 880° C. 900° C., and 950C. for 40 hours in air. In the same manner as in Example 9, for columnar pieces made from these pellets, the change of electric resistance with temperature was measured. Further, the volume fraction of superconductor which showed a critical temperature of 108 K was obtained in the same manner as in Example 9. The results are shown in Table 6. The sample fired at 950° C. was molten and was an oxide of high resistance.

TABLE 6

| Firing temperature (°C.) | 820 | 840 | 860 | 880 | 900 |
|---|---|---|---|---|---|
| Critical temp. (K) (Resistance zero) | — | 60 | 77 | 78 | 55 |
| Volume fraction (%) | 0 | 23.5 | 90.7 | 98.3 | 15 |

Example 19

In the same manner as in Example 18, two samples were prepared so as to have Tl:Ba:Sr:Ca:Cu= 1:0.20:1.80:1:2, 1:0.40:1.60:1:2, 1:0.6:1.4:1:2, 1.0:1.2:0.8:1:2, 1:1:1:1:2, 2:1:1:1:2, 1:1.2:0.8:1:2, 1:1.4:0.6:1:2, 2:1.6:0.4:1:2, 1:1.6:0.4:1:2, 2:1.8:0.2:1:2 and 1:1.8:0.2:1:2. These pellets were fired at 890° C. for 24 hours in air. In the same manner as in Example 9, for sample pieces made from these pellets, the change of electric resistance with temperature was measured. The results are shown in Table 7 together with the results obtained in Example 18.

TABLE 7

| Composition | | | | | Critical temperature (K, resistance zero) | Volume fraction (% at 77K) |
|---|---|---|---|---|---|---|
| (Tl: | Ba: | Sr: | Ca: | Cu) | | |
| 1 | 0 | 2 | 1 | 2 | 78 | 95.3 |
| 1 | 0.20 | 1.80 | 1 | 2 | 83 | 98.5 |
| 1 | 0.40 | 1.60 | 1 | 2 | 85 | 98.7 |
| 1 | 0.60 | 1.40 | 1 | 2 | 84 | 98.7 |
| 1 | 0.80 | 1.20 | 1 | 2 | 83 | 99.8 |
| 1 | 1 | 1 | 1 | 2 | 85 | 99.6 |
| 2 | 1 | 1 | 1 | 2 | 68 | 45.3 |
| 1 | 1.20 | 0.80 | 1 | 2 | 85 | 99.8 |
| 1 | 1.40 | 0.60 | 1 | 2 | 86 | 99.9 |
| 2 | 1.60 | 0.40 | 1 | 2 | 66 | 53.1 |
| 1 | 1.60 | 0.40 | 1 | 2 | 85 | 99.9 |
| 2 | 1.80 | 0.20 | 1 | 2 | 63 | 62.7 |
| 1 | 1.80 | 0.20 | 1 | 2 | 85 | 99.8 |

Figure 10:
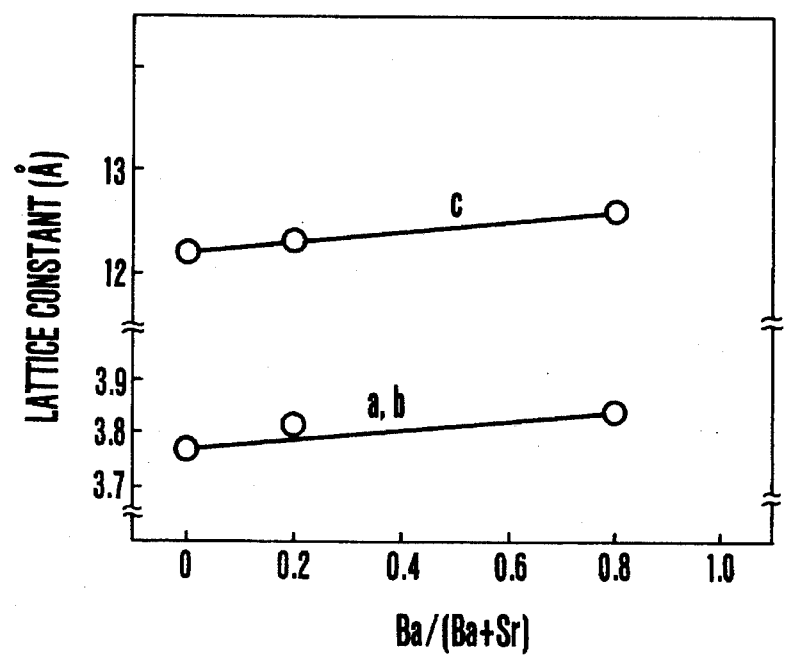
FIG. 10 is a graph which shows the lattice constant of crystal of superconducting phase of Tl-Sr-Ba-Ca-Cu-O in the level of 70–100 K of the present invention.

The thus obtained superconductors were subjected to X-ray powder diffractometry to example the crystal structure. Analysis showed the change of lattice constant with change in composition as shown in FIG. 10. That is, the structure was a layer perovskite structure comprising two $CuO_2$ layers sandwiched between single Tl-O layers. In this case, a sample of a composition corresponding to Tl-O double layers contained heterogeneous phase.

Example 20

Figure 11:
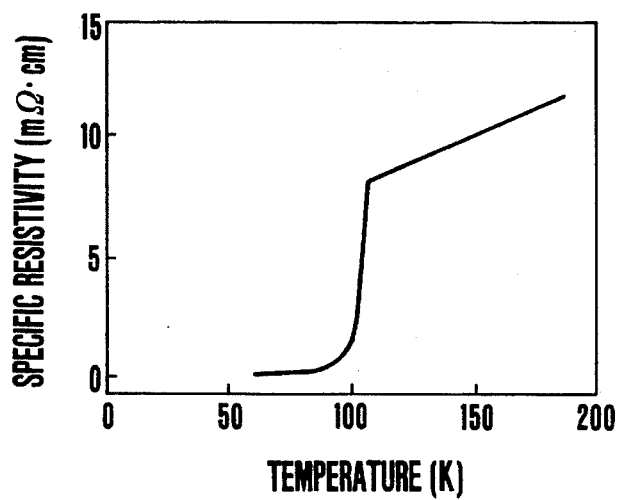
FIG. 11 is a graph which shows a change of electrical resistance with temperature of the oxide superconductor obtained in Example 19 according to the present invention.
Figure 12:
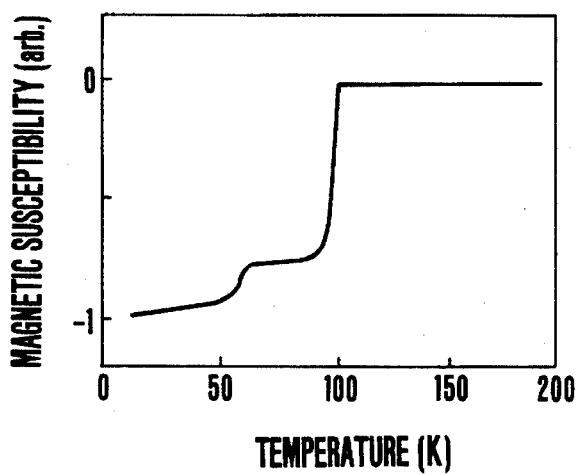
FIG. 12 is a graph which shows a change of inductance of the oxide superconductor obtained in Example 19 according to the present invention.

$SrCO_3$: 5.90 g, $CaCO_3$: 4.00 g, and CuO: 4.,77 g were milled and mixed in an agate mortar of a grinder for about 30 minutes. The resulting powder was put in a magnetic alumina crucible and fired at 900° C. for 15 hours. The fired body was again milled in an agate mortar of a grinder for about 30 minutes. To the resulting powder was added 9.13 g of $Tl_2O_3$, followed by mixing for about 30 minutes by a grinder. 4 g of the resulting powder was press molded into a pellet of 30 mm in diameter. This pellet was placed in an alumina crucible and the crucible was covered with an alumina plate, followed by firing at 870° C. for 5 hours in air. The resulting pellet comprises oxide crystal having an approximate atomic ratio of Tl:Sr:Ca:Cu=2:2:2:3. A columnar piece of 15 mm×5 mm×1 mm was cut out from this pellet. Four terminals were connected to this piece with an indium solder and the change of electric resistance with change in temperature was measured by a four-terminal resistance method with liquid nitrogen as a refrigerant. As a result, the critical temperature at onset was 101 K. The change of electric resistance of this sintered body with temperature is shown in FIG. 11. Furthermore, for this sintered body, the change of inductance with temperature was measured by an alternating current method and the results are shown in FIG. 12. The volume fraction of superconductor in this sintered body was obtained using as a standard the change in inductance based on superconducting transition of lead. This was 85.4%.

Example 21

Five pellets prepared in the same manner as in Example 20 were fired at 820° C., 840° C., 860° C., 880° C., and 900° C. for 5 hours in air. In the same manner as in Example 20, for columnar pieces made from these pellets, the change of electric resistance with temperature was measured. The results are shown in Table 8. The sample fired at 900° C. was molten and was an oxide of high resistance.

TABLE 8

| Firing temperature (°C.) | 820 | 840 | 860 | 880 | 900 |
|---|---|---|---|---|---|
| Critical temperature (K) (onset) | 78 | 78 | 101 | 101 | — |

Example 22

Figure 13:
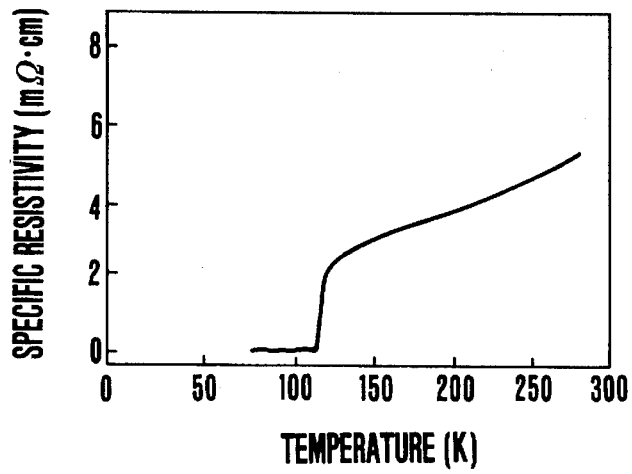
FIG. 13 is a graph which shows a change of electrical resistance with temperature of the oxide superconductor obtained in Example 21 according to the present invention.

$BaCO_3$: 3.95 g, $SrCO_3$: 2.95 g, $CaCO_3$: 4.00 g, and CuO: 4.77 g were milled and mixed in an agate mortar of a grinder for about 30 minutes. The resulting powder was put in a magnetic alumina crucible and fired at 900° C. for 15 hours. The fired body was again milled in an agate mortar of a grinder for about 30 minutes. To the resulting powder was added 9.31 g of $Tl_2O_3$, followed by mixing for about 30 minutes by a grinder. 4 g of the resulting powder was press molded into a pellet of 30 mm in diameter. This pellet was placed in an alumina crucible and the crucible was covered with an alumina plate, followed by firing at 870° C. for 3 hours in air. The resulting pellet comprised oxide crystal having an approximate atomic ratio of Tl:Ba:Sr:Ca:Cu= 2:1:1:2:3. A columnar piece of 15 mm×5 mm×1 mm was cut out from this pellet. Four terminals were connected to this piece with an indium solder and the change of electric resistance with change in temperature was measured by a four-terminal resistance method with liquid nitrogen as a refrigerant. As a result, as shown in FIG. 13, the critical temperature at onset was 120 K and electric resistance became zero at 108 K. Furthermore, for this sintered body, the change of inductance with temperature was measured by an alternating current method. The volume fraction of superconductor of this sintered body which showed a critical temperature of 108 K was obtained using as a standard the change in inductance due to the superconducting transition of lead. This was 85.7%.

Example 23

Two pellets prepared in the same manner as in Example 22 so as to have Tl:Ba:Sr:Ca:Cu=2:0.25:0.75:2:3 and 2:0.75:0.25:2:3 were fired at 850° C. for 3 hours in air. In the same manner as in Example 20, for columnar pieces made from these pellets, the change of electric resistance with temperature was measured. The results are shown in Table 9 together with the result obtained in Examples 20 and 22.

TABLE 9

| Composition (Tl:Ba:Sr:Ca:Cu) | Critical temperature (K, Resistance zero) |
|---|---|
| 2:2:0:2:3 | 120 |
| 2:0.75:0.25:2:3 | 106 |
| 2:1:1:2:3 | 108 |
| 2:0.25:0.75:2:3 | 90 |

Example 24

The pellets prepared and molded as in Example 20 were enclosed in an alumina container of 100 ml in volume and this container was placed in an electric furnace having 3% oxygen atmosphere diluted with argon to carry out firing at 820° C. for 5 hours. From the thus obtained sample, a columnar piece of 15 mm×5 mm×1 mm was cut out in the same manner as in Example 20. Four terminals were connected thereto with an indium solder and the change of electric resistance with temperature was measured by a four-terminal resistance method using liquid nitrogen as a refrigerant. The critical temperature at onset was 101 K and electric resistance became zero at 90 K. The change of inductance of this sintered body with temperature was measured by an alternating current method and the volume fraction of superconductor of the sintered body which showed a critical temperature of 90 K was obtained using as a standard the change in inductance due to the superconducting transition of lead. It was 81.6%.

Example 25

Two liters of aqueous solution containing 248 g of ammonium oxalate was referred to as solution A. One liter of an aqueous solution containing 78.0 g of $Tl(NO_3)_3$, 42.3 g of $Sr(NO_3)_2$, 32.8 g of $Ca(NO_3)_2$ and 74.2 g of $Cu(NO_3)_2 \cdot 3H_2O$ was referred to as solution B. Solution B was added at a rate of 2 l/hr to solution A at 40° C. with stirring. After completion of the addition, stirring was continued for 30 minutes and then the solution was subjected to solid-liquid separation. The resulting solid matter was charged in an alumina crucible and dried at 120° C. and furthermore fired at 500° C. for 3 hours in air. This fired body was milled and mixed in an agate mortar of a grinder for about 30 minutes. 4 g of the resulting powder was press molded into a pellet of 30 mm in diameter. This pellet was placed in an alumina crucible and this crucible was covered by an alumina plate and the pellet was fired at 840° C. for 3 hours in air. The thus obtained pellet comprised oxide crystal of an approximate atomic ratio of Tl:Sr:Ca:Cu= 2:2:2:3.

From this pellet a columnar piece of 15 mm×5 mm×1 mm was cut out and four terminals were connected thereto with an indium solder. The change of electric resistance with temperature was measured by a four-terminal resistance method using liquid nitrogen as a refrigerant. As a result, the critical temperature at onset was 101 K and electric resistance became zero at 90 K. Further, the change of inductance with temperature of this sintered body was measured by an alternating current method and the volume fraction of superconductor which showed a critical temperature of 90 K was obtained using as a standard the change in inductance caused by the superconducting transition of lead. It was 80.1%.

Example 26

$SrCO_3$: 11.8 g, $CaCO_3$: 8.0 g and CuO: 9.6 g were milled and mixed in an agate mortar of a grinder for 30 minutes.

The resulting powder was put in a magnetic alumina crucible and fired at 900° C. for 20 hours. The fired body was again milled in an agate mortar of a grinder for about 30 minutes. Thereto was added 9.31 g of $Tl_2O_3$, followed by mixing for about 30 minutes by a grinder. The resulting powder in an amount of 10 g was press molded into a pellet of 40 mm in diameter. The resulting pellet was fired at 700° C. for 5 hours in air. Using this pellet as a target, a film-shaped composition was produced on an MgO single crystal substrate of 20 mm×5 mm by a sputtering method. Plane (001) of the MgO single crystal was used as the substrate. The sputtering was carried out at an accelerating voltage of 2 kV in an atmosphere of 40% oxygen diluted with argon under $1\times10^{-2}$ torr. The thickness of the resulting film was about 1 μm.

The thus obtained two film-shaped compositions were put on the pellet before firing prepared in Example 9 and these were placed in an alumina crucible and this was covered with an alumina plate and the pellets were fired at 860° C. for 1 hour in air. The thus obtained film-shaped composition was an oxide having an approximate atomic ratio of Ti:Sr:Ca:Cu=2:2:2:3.

Four terminals were connected to one film-shaped composition by a silver paste and the change of electric resistance with change in temperature was measured by a four-terminal resistance method using liquid nitrogen as a refrigerant. As a result, the critical temperature at onset was 98 K and electric resistance became zero at 88 K.

Another one of the film-shaped composition was subjected to pattern etching so that the central portion had a width of 0.1 mm and four terminals were connected to both ends with a silver paste. The current-voltage characteristics were measured by a direct current method. The critical current density at the temperature of liquid nitrogen when a detection terminal voltage was 1 μV/cm was 3,500 A/cm².

Example 27

Five pellets of the oxide superconductor prepared in Example 20 were milled for 1 hour by an agate ball mill. The resulting powder of 3–5 μm in mean particle diameter was filled in a silver pipe of 6 mm in diameter and this was drawn by a drawbench to a diameter of 1.8 mm to obtain a wire-shaped molded body having a silver sheath. This was rolled to a thickness of 0.1 mm by a rolling mill to obtain a tape-shaped molded body. This tape-shaped molded body was cut to 25 mm in length and fired at 850° C. for 5 hours in an oxygen stream.

Four terminals were connected to this sample with an indium solder and the current-voltage characteristics were measured by a direct current four-terminal resistance method. The critical current density at the temperature of liquid nitrogen when a detection terminal voltage was 1 μV/cm was 3,100 A/cm².

Example 28

$SrCO_3$: 5.90 g, $CaCO_3$: 2.00 g, and CuO: 3.18 g were milled and mixed in an agate mortar of a grinder for about 30 minutes. The resulting powder was put in a magnetic alumina crucible and fired at 900° C. for 15 hours. The fired body was again milled in an agate mortar of a grinder for about 30 minutes. To the resulting powder was added 9.13 g of $Tl_2O_3$, followed by mixing for about 30 minutes by a grinder. 4 g of the resulting powder was press molded into a pellet of 30 mm in diameter. This pellet was placed in an alumina crucible and the crucible was covered with an alumina plate. The pellet was fired at 880° C. for 4 hours in air. This pellet comprised oxide crystal having an approximate atomic ratio of Ti:Sr:Ca:Cu=2:2:1:2.

A columnar piece of 15 mm×5 mm×1 mm was cut out from this pellet. Four terminals were connected to this piece with an indium solder and the change of electric resistance with change in temperature was measured by a four-terminal resistance method using liquid nitrogen as a refrigerant. As a result, the critical temperature at onset was 78 K and electric resistance became zero at 68 K.

Example 29

Powders of SrO, Cao and CuO, respectively, were weighed so as to obtain Sr:Ca:Cu molar ratios of 2:1:2 and 2:2:3, and then milled and mixed by an agate-made mortar and pestle for about 30 minutes. The resulting mixtures were fired in an alumina crucible in air at 900° C. for 10 hours. The fired products were again milled by the agate-made mortar and pestle for 30 minutes. To the resulting powder were added powders of $Tl_2O_3$ and PbO, respectively, weighed so as to obtain Tl:Pb molar ratios of 0.8:0.2, 0.6:0.4 and 0.5:0.5. The admixtures were again milled and mixed by the agate-made mortar and pestle for 30 minutes. The compositions of the thus prepared charges are shown in Table 10. 2 grams of the respective charges were press molded in pellets of 20 mm in diameter. From each of these pellets was cut out a columnar piece of about 2 mm×20 mm×1 mm thick, which was sealed in an Au tube. This testing sample in the Au tube was fired at 845°–915° C. for 3 hours to obtain a sintered body. The critical temperatures Tc of the bodies were determined by a four-terminal resistance method. The results are shown in Table 10. Furthermore, the volume fraction of superconductor in the bodies were determined by an inductance method. The results are shown in Table 10. From Table 10 it is seen that the addition of Pb introduced improvement in Tc and volume fraction over EXAMPLES 9 and 17.

TABLE 10

| No. | Composition of charges Tl:Pb:Sr:Ca | Tc [°K.] | Volume fraction [%] |
|---|---|---|---|
| 1 | 0.8:0.2:2:1:2 | 80 | 96.9 |
| 2 | 0.6:0.4:2:1:2 | 83 | 97.4 |
| 3 | 0.5:0.5:2:1:2 | 85 | 98.7 |
| 4 | 0.8:0.2:2:2:3 | 108 | 95.3 |
| 5 | 0.6:0.4:2:2:3 | 115 | 97.0 |
| 6 | 0.5:0.5:2:2:3 | 12 | 98.9 |

Example 30

Powders of SrO, CaO and CuO, respectively, were weighed so as to obtain such molar ratios as shown in Table 11 and then milled and mixed by an agate-made mortar and pestle for about 30 minutes to prepare sample powders having such compositions as shown in Table 11. The resulting powders were fired in an alumina crucible in air at 900° C. for 10 hours. To these powders were added $K_2O$, $Li_2O$ and $Pb_2O$ in an amount as weighed so as to obtain such molar ratios as shown in Table 11. These powders were milled and mixed by the mortar and pestle for 30 minutes. The resulting powders were fired in air at 900° C. for 10 hours. The fired powders were milled and mixed by the mortar and pestle. To these powders was added $Tl_2O_3$ powder in such amounts as shown in Table 11 and then mixed. 2 grams of the resulting powders were press molded in pellets of 20 mm in diameter. From each of these pellets was cut out a columnar piece of about 2 mm× mm×1 m thick, which was sealed in an Au tube. This testing sample in the Au tube was fired at 780°–900° C. for 3 hours to obtain a sintered body. The critical temperatures Tc of the bodies were determined by a four-terminal resistance method. The results are shown in Table 11. From Table 11 it is seen that the addition of alkali metals can reduce the firing temperature. Furthermore, the observation of the micro-structures of the sintered bodies were made by a scanning electron microscope. As a result, remarkable growth of particles was found.

TABLE 11

| Composition of charges Tl:K:Ba:Sr:Ca:Cu | Tc [°K.] |
|---|---|
| 1.8:0.2:1.8:0.2:1:2 | 108 |
| 1.5:0.5:1.6:0.4:1:2 | 105 |
| 1:1:1.6:0.4:1:2 | 103 |
| 1.6:0.4:1.8:0.2:2:3 | 120 |
| 1:1:1.8:0.2:2:3 | 117 |
| 0.8:0.2:0.4:1.6:1:2 | 87 |
| 0.5:0.5:0.2:1.8:1:2 | 83 |
| 0.8:0.2:0.4:1.6:2:3 | 109 |
| 0.5:0.5:0.2:1.8:2:3 | 104 |
| 1.9:0.1:1.8:0.2:1:2 | 106 |
| 1.6:0.4:1.7:0.3:1:2 | 104 |
| 1:1:1.6:0.4:1:2 | 100 |
| 1.8:0.2:1.6:0.4:2:3 | 117 |
| 1:1:1.6:0.4:2:3 | 115 |
| 0.7:0.3:0.4:1.6:1:2 | 86 |
| 0.5:0.5:0.2:1.8:1:2 | 85 |
| 0.7:0.3:0.4:1.6:2:3 | 104 |
| 0.5:0.5:0.2:1.8:2:3 | 102 |
| 1.6:0.4:1.8:0.2:1:2 | 106 |
| 1:1:1.8:0.2:1:2 | 102 |
| 1.6:0.4:1.8:0.2:2:3 | 117 |
| 1:1:1.8:0.2:2:3 | 116 |
| 0.8:0.2:0.2:1.8:1:2 | 88 |
| 0.5:0.5:0.2:1.8:1:2 | 84 |
| 0.8:0.2:0.2:1.8:2:3 | 106 |
| 0.5:0.5:0.2:1.8:2:3 | 103 |

Example 31

Powders of SrO, CaO and CuO, respectively, were weighed so as to obtains such molar ratios as shown in Table 12 and then milled and mixed by an agate-made mortar and pestle for about 30 minutes. The resulting powders were fired in an alumina crucible in air at 900° C. for 10 hours. The fired body was milled and mixed by the agate-made mortar and pestle for about 15 minutes. To these powders was added $Tl_2O_3$ in such an amount as weighed so as to obtain such molar ratios as shown in Table 12. These powders were milled and mixed by the mortar and pestle for about 15 minutes. 2 grams of these powders were press molded in pellets of 20 mm in diameter. These pellets were placed on alumina plates and fired in air at 875° C. for 2 hours, where a powder having the same composition as that of the pellets was placed between the pellets and the plates and further over the pellets to cover the pellets and the whole was covered by an alumina crucible, in order to inhibit the evaporation of Tl. The critical temperatures of the resulting samples were determined by a four-terminal resistance method. The results are shown in Table 12. The resulting samples were heat treated in an argon atmosphere at 400° C. for 1 hour. The critical temperatures were changed as shown in Table 12. Particularly, it is seen that there was conspicuous improvement on samples Nos. 4 to 7. It is considered that this improvement is contributed to by a change of the carrier concentration due to the heat treatment.

TABLE 12

| No. | Composition of charge Tl:Sr:Ba:Cu | Tc after firing [°K.] | Tc after heat treating [°K.] |
|---|---|---|---|
| 1 | 1:1.8:0.2:1 | 17 | 20 |
| 2 | 1:1.6:0.4:1 | 18 | 20 |
| 3 | 1:1.2:0.8:1 | 20 | 22 |
| 4 | 2:1:1:1 | 15 | 50 |
| 5 | 2:0.8:1.2:1 | 17 | 54 |
| 6 | 2:0.4:1.6:1 | 19 | 75 |
| 7 | 2:0.2:1.8:1 | 20 | 85 |

Example 32

Sintered bodies from the samples prepared as in EXAMPLE 1, as shown in Table 1 and the samples prepared as in EXAMPLE 3, as shown in Table 3 were subjected to chemical quantitative analysis through the ICP (Inductively Coupled Plasma Spectrometer) method. The results are shown in Table. 13. The chemical analysis was determined by calculation with the molar ratio of Cu being 3. The chemical analysis of each of the elements, St, Ba, Ca and Cu was substantially equal to the composition of charge within the range of measurement error, but the chemical analysis of Tl was reduced. The sintered bodies from the compositions of charge: Ti:Sr:Ba:Ca:Cu of 2:0.4:1.6:2:3 and 1:1.6:0.4:2:3 were subjected to the X-ray diffraction analysis. From the results, the sites and occupying rates of the five elements in the crystal were determined by the calculation with the Rietveld analysis method. The results are shown in Table 14. It is seen that the occupying rate of the Tl site is lower than 1 in all the cases. This appears to mean that some of the Tl element are deficient in the basic structure as shown in FIGS. 3(a) and 3(b).

TABLE 13

Chemical Analysis of Sintered Bodies

| Composition of charge Tl:Sr:Ba:Ca:Cu | ICP analysis | | | | |
|---|---|---|---|---|---|
| | Tl | Sr | Ba | Ca | Cu |
| 2:0.4:1.6:2:3 | 1.67 | 0.41 | 1.59 | 2.0 | 3.0 |
| 2:0.8:1.2:2:3 | 1.63 | 0.82 | 1.17 | 2.0 | 3.0 |
| 2:1:1:2:3 | 1.58 | 0.98 | 1.0 | 2.04 | 3.0 |
| 2:1.2:0.8:2:3 | 1.65 | 1.2 | 0.79 | 2.01 | 3.0 |
| 2:1.6:0.4:2:3 | 1.54 | 1.63 | 0.41 | 2.0 | 3.0 |
| 1:0.4:1.6:2:3 | 0.81 | 0.46 | 1.58 | 2.05 | 3.0 |
| 1:0.8:1.2:2:3 | 0.83 | 0.80 | 1.21 | 1.99 | 3.0 |
| 1:1:1:2:3 | 0.85 | 0.98 | 1.01 | 2.02 | 3.0 |
| 1:1.2:0.8:2:3 | 0.89 | 1.17 | 0.76 | 2.01 | 3.0 |
| 1:1.6:0.4:2:3 | 0.73 | 1.54 | 0.41 | 2.0 | 3.0 |

TABLE 14

Results of Rietveld Analysis (a) Sintered body of $Tl_2Sr_{0.4}Ba_{1.6}Ca_2O_{10}$

| R.f. [%] | | | 4.02 | | |
|---|---|---|---|---|---|
| Lattice const. a | | | 3.8453(1) | | |
| [Å] c | | | 35.486(2) | | |

| Element | Site | X | Y | Z | g | B |
|---|---|---|---|---|---|---|
| Tl | 4e | 0 | 0 | 0.2202(3) | 0.83(3) | 0.8 |
| Ba | 4e | 0.5 | 0.5 | 0.1458(3) | 0.6(1) | 0.5 |
| Sr | 4e | 0.5 | 0.5 | 0.1458(3) | 0.4(1) | 0.5 |

TABLE 14-continued

Results of Rietveld Analysis

| Element | Site | X | Y | Z | g | B |
|---|---|---|---|---|---|---|
| Ca | 4e | 0.5 | 0.5 | 0.0471(5) | 1.26(9) | 0.1 |
| Cu(2) | 4e | 0 | 0 | 0.0895(7) | 1.0 | 0.3 |
| Cu(1) | 2b | 0 | 0 | 0.0 | 1.0 | 0.1 |
| O(4) | 4e | 0.5 | 0.5 | 0.223(3) | 1.0 | 0.9 |
| O(3) | 4e | 0 | 0 | 0.165(3) | 1.0 | 0.9 |
| O(2) | 8g | 0 | 0.5 | 0.0873(2) | 1.0 | 0.8 |
| O(1) | 4c | 0 | 0.5 | 0.0 | 1.0 | 0.6 |

(b) Sintered body of $Tl_1Sr_{1.6}Ba_{0.4}Ca_2Cu_3O_9$

| | | | | | | |
|---|---|---|---|---|---|---|
| R.f. [%] | | | | 4.02 | | |
| Lattice const. a [Å] | | | | 3.8453(1) | | |
| c | | | | 35.486(2) | | |

| Element | Site | X | Y | Z | g | B |
|---|---|---|---|---|---|---|
| Tl | 1l | 0 | 0 | 0 | 0.86 (2) | 1.8 |
| Ba | 2h | 0.5 | 0.5 | 0.1691(8) | 0.12 (6) | 1.1 |
| Sr | 2h | 0.5 | 0.5 | 0.1691(8) | 0.88 | 1.1 |
| Ca | 2h | 0.5 | 0.5 | 0.390(1) | 1.22(4) | 0.5 |
| Cu(1) | 1b | 0 | 0 | 0.5 | 1.0 | 0.3 |
| Cu(2) | 2g | 0 | 0 | 0.287(1) | 1.0 | 0.3 |
| O(1) | 1e | 0 | 0.5 | 0.5 | 1.0 | 0.5 |
| O(2) | 4i | 0 | 0.5 | 0.302(3) | 1.0 | 0.5 |
| O(3) | 2g | 0 | 0 | 0.138(4) | 1.0 | 0.5 |
| O(4) | 4n | 0.5 | 0 | 0.5 | 1.0 | 0.5 |

Notes:
X, Y and Z: axes
g: occupying rate
B: thermal vibration parameter

We claim:

1. An oxide superconductor which comprises a perovskite type oxide compound of thallium, strontium, barium, calcium and copper, wherein said oxide superconductor has a composition represented by the general formula of $$Tl_1(Ba_{1-x}Sr_x)_2Ca_2Cu_3O_z$$

wherein $0<x<1.0$ and $5 \leq z \leq 14$.

* * * * *